US005559839A

United States Patent [19]

Doelman

[11] Patent Number: 5,559,839

[45] Date of Patent: Sep. 24, 1996

[54] SYSTEM FOR THE GENERATION OF A TIME VARIANT SIGNAL FOR SUPPRESSION OF A PRIMARY SIGNAL WITH MINIMIZATION OF A PREDICTION ERROR

[75] Inventor: Nicolaas J. Doelman, Delft, Netherlands

[73] Assignee: Nederlandse Organisatie voor Toegepast-Natuurwetenschappelijk Onderzoek TNO, Delft, Netherlands

[21] Appl. No.: 352,671

[22] Filed: Nov. 30, 1994

[30] Foreign Application Priority Data

Nov. 30, 1993 [NL] Netherlands .......................... 9302076

[51] Int. Cl.[6] .............................. H04B 1/10; H03H 7/30

[52] U.S. Cl. ...................... 375/350; 375/233; 364/724.20

[58] Field of Search .............................. 381/71; 375/232, 375/233, 285, 346, 350; 364/724.19, 724.20; 333/18, 28 R; 367/901

[56] References Cited

U.S. PATENT DOCUMENTS

| | | | |
|---|---|---|---|
| 4,677,676 | 6/1987 | Eriksson | 381/71 |
| 5,117,401 | 5/1992 | Feintuch | 381/71 |
| 5,135,079 | 8/1992 | Shimazaki | 187/1 R |
| 5,150,414 | 9/1992 | Ng | 381/47 |
| 5,274,670 | 12/1993 | Serizawa et al. | 375/233 |
| 5,377,276 | 12/1994 | Terai et al. | 381/71 |
| 5,388,080 | 2/1995 | Feintuch et al. | 367/901 |
| 5,414,733 | 5/1995 | Turner | 375/233 |

FOREIGN PATENT DOCUMENTS

| | | |
|---|---|---|
| 0590350 | 4/1994 | European Pat. Off. . |
| 5040485 | 2/1993 | Japan . |

*Primary Examiner*—Tesfaldet Bocure
*Attorney, Agent, or Firm*—Young & Thompson

[57] ABSTRACT

System for the generation of a time variant signal (sec(t)) for suppression of a primary signal (d(t)), provided with a control unit (1) provided with an adaptive digital filter (10, 11) for providing a cancellation control signal (u(t)), cancellation-generating unit (2) for generating a cancellation signal which is propagated along a secondary path with a transfer function and then providing the time variant signal (sec(t)), sensor unit (4) for measuring a residual signal (ε(t)), update unit (5) provided with a first input for receiving the output signal (y(t)), a second input for receiving the cancellation control signal (u(t)), and a third input for receiving said reference signal (x(t)), wherein the update unit (5) is provided with a prediction filter (8) which is arranged to calculate a predicted value ($y_{pred}$(t)) based on the signals actually received on the first, second, and third inputs such that said predicted value ($y_{pred}$(t)) equals an anticipated, calculated output value of the sensor unit (4), calculated under the assumption that filter coefficients of the adaptive digital filter (10, 11) were already updated in accordance with the signals actually received on the first, second, and third inputs, said predicted value ($y_{pred}$(t)) being used by the update unit to calculate the update signal (up(t)) to be transmitted to the control unit (1).

16 Claims, 2 Drawing Sheets

SYSTEM FOR THE GENERATION OF A TIME VARIANT SIGNAL FOR SUPPRESSION OF A PRIMARY SIGNAL WITH MINIMIZATION OF A PREDICTION ERROR

BACKGROUND OF THE INVENTION

The present invention relates to a system for the generation of a time variant signal for suppression of a primary signal, comprising:

- a control unit at least provided with one digital filter, an input for receiving an update signal for updating coefficients of the digital filter and an output for providing a cancellation control signal;
- cancellation-generating means which are connected to the output of the control unit for the generation of a cancellation signal, which is intended, after propagation along a secondary transfer path having a path transfer function, to be added as the time variant signal at an addition point to the primary signal in order to provide a residual signal,
- sensor means for measuring the residual signal at the addition point and for providing an output signal;
- update means provided with an input which is connected to the sensor means and an output for providing the update signal.

A system of this type is disclosed in US Patent 4,677,676, in which a system for the generation of an estimated time variant signal is described which, for example, can be used in the field of noise or vibration suppression. The known system has to generate a cancellation signal which has an amplitude which is at least approximately of equal magnitude but of opposite sign to a primary signal, so that the effect of the primary signal can be cancelled by adding the two signals.

The known system comprises a control unit which is connected to a sensor which detects the primary signal and a sensor which detects a residual signal, that is to say the signal which remains after adding the primary signal and the generated cancellation signal. The coefficients of the digital filter can be adapted by the residual signal.

The convergence speed and stability of the known system are adversely affected by the time delay and the possible phase shift between the output of the control unit and the location where the cancellation signal is added to the primary signal in order as far as possible to cancel the primary signal. In an anti-noise system, for example, the output signal from the control unit is converted between the output of the control unit and the addition point into an acoustic signal, which traverses an acoustic path. The path is indeed termed the secondary acoustic path, in contrast to the primary acoustic path, which is traversed by the primary signal itself. The delays associated with acoustic paths are appreciable compared with the delays to which electrical signals are subject. In the known system no account is taken of the influence of the transfer function associated with the acoustic path, which has an adverse effect on the convergence of the calculations in the filter in the control unit. The same applies in the case of vibration systems, in which undesirable vibrations are propagated by a mechanical construction and have to be cancelled out with the aid of a vibration generator, anti-vibrations generated being propagated by a secondary vibration path.

SUMMARY OF THE INVENTION

It is therefore an objective of the invention to provide a system of the abovementioned type which takes account of the transfer function of the secondary path.

To this end, the system according to the invention is characterised in that the update unit comprises a prediction filter which is equipped to receive the cancellation control signal and the output signal from the sensor means and is intended to generate a predicted value, which predicted value is equal to the anticipated output value of the sensor means at a specific point in time, if the coefficients of the digital filter had had the most recently obtained values during the entire reaction time of the secondary transfer path.

With a system of this type it is possible to achieve a much higher convergence speed for calculation of the coefficients of the digital filter unit used in the control unit than is possible with the known system. Moreover, the stability is easier to maintain.

In a first embodiment, the control unit and the update unit are both equipped to receive a reference signal and the digital filter comprises at least a forward filter.

In a further embodiment, the control unit has a further input for receiving the output signal from the sensor and the digital filter comprises at least a feedback filter.

The use of both a forward filter and a feedback filter renders the circuitry more robust against influences such as:

- disturbances in the residual signal which are not part of the reference signal, for example an alinear relationship between the reference signal and the output signal from the sensor means,
- disturbances in the residual signal which arise only subsequently in the reference signal, such as can easily be the case when vibrations are cancelled out,
- changes in the acoustic path between cancellation control signal and residual signal, for example as a consequence of a change in temperature.

Both the forward filter and the feedback filter can be a transversal or a recursive filter.

Preferably, the prediction filter is equipped to calculate the predicted value in accordance with the following equation:

$$y_{pred}(t)=y(t)-Wx^{FF}(t)-Ru^{FF}(t)-Sy^{FF}(t)$$

where:

W indicates a first time vector $$W(t)=[w_0(t)\ w_1(t)\ \ldots\ w_{nw}(t)]$$

R indicates a second time vector $$R(t)=[1\ r_1(t)\ \ldots\ r_{nr}(t)]$$

S indicates a third time vector $$S(t)=[s_0(t)\ s_1(t)\ \ldots\ s_{ns}(t)]$$

W(o), R(o), and S(o) have predetermined values and W(t), R(t), S(t) for t>o are determined by:

$$\bar{\theta}(t)=\bar{\theta}(t-1)-\mu(t)F^{-1}(t)\ [\partial J(\bar{\theta}\ (t-1))/\partial\bar{\theta}(t-1)]$$

where:

μ(t)=step size parameter $F^{-1}$=a matrix for optimising the direction.

$$\bar{\theta}=[1 r_1(t)\ \ldots\ r_{nr}(t)/w_o(t)\ \ldots\ w_{nw}(t)/\ s_o(t)\ \ldots\ s_{ns}(t)]$$

and wherein input signals $y^{FF}(t)$, $u^{FF}(t)$ and $x^{FF}(t)$ are defined as follows:

$$y^{FF}(t)=\frac{B}{A}\cdot y(t)$$

$$u^{FF}(t)=\frac{B}{A}\cdot u(t)$$

$$x^{FF}(t)=\frac{B}{A}\cdot x(t)$$

where:

B/A=transfer function of the secondary transfer path.

In addition, the update means are preferably equipped to calculate the update signal in accordance with the following three components:

$$\overline{up_W}=\mu(t)\cdot F^{-1}(t)\cdot y_{pred}(t)\cdot\overline{\phi_x}(t)$$

$$\overline{up_R}=\mu(t)\cdot F^{-1}(t)\cdot y_{pred}(t)\cdot\overline{\phi_u}(t)$$

$$\overline{up_S}=\mu(t)\cdot F^{-1}(t)\cdot y_{pred}(t)\cdot\overline{\phi_y}(t)$$

where:

$\mu(t)$=step size parameter $F^{-1}(t)$=direction optimalisation matrix $$\overline{\phi_x}(t)=[x^F(t)\quad x^F(t-1)\ldots x^F(t-n_w)]^T$$

$$\overline{\phi_u}(t)=[u^F(t-1)\quad u^F(t-2)\ldots u^F(t-n_r)]^T$$

$$\overline{\phi_y}(t)=[y^F(t)\quad y^F(t-1)\ldots y^F(t-n_s)]^T$$

and the control unit is equipped to update the filter coefficients of the forward filter having transfer function —W/R and the feedback filter having transfer function —S/R in accordance with:

$$\overline{\theta_W}(t)=\overline{\theta_W}(t-1)+\overline{up_W}(t)$$

$$\overline{\theta_R}(t)=\overline{\theta_R}(t-1)+\overline{up_R}(t)$$

$$\overline{\theta_S}(t)=\overline{\theta_S}(t-1)+\overline{up_S}(t)$$

In the system according to the invention the update unit can be equipped to calculate the update signal with the aid of the LMS algorithm known per se, so that F is equal to the identity matrix.

As an alternative, the update unit can be equipped to calculate the update signal with the aid of the normalised LMS algorithm known per se, so that F is equal to the average of the square of the energy of all input signals $x^F$, $u^F$ and $y^F$.

However, the update unit can also be equipped to calculate the update signal with the aid of the RLS algorithm known per se, so that F is equal to the estimated hessian of the error criterion.

Preferably, the forward filter and the feedback filter are implemented in software.

Furthermore, the update unit together with the prediction filter can also be implemented in software.

The cancellation generating means can comprise one or more loudspeakers or vibration actuators and the sensor means can comprise one or more microphones or vibration sensors.

Finally, an identification unit can be installed which has a first input which is coupled to the sensor means, a second input for receiving the reference signal, a third input for receiving the cancellation control signal and an output which is coupled to the prediction filter for providing an estimate of the transfer function of the secondary transfer path.

BRIEF DESCRIPTION OF THE DRAWINGS

The invention will be explained below with reference to a few drawings, which illustrate the principle according to the invention and are not intended to imply any restriction thereof and in which.

DETAILED DESCRIPTION OF THE EMBODIMENTS

The principle of the invention will be explained in more detail below with reference to an anti-noise system in which the filter coefficients of the digital filter present in the control unit are adapted with the aid of a modified least mean squares algorithm, which is also termed "modified LMS algorithm" below. However, the principles of the invention are not restricted to a modified LMS algorithm, but can also be applied to other known algorithms for adaptation of the filter coefficients, for example RLS.

The given principles are also applicable in, for example, anti-vibration systems, in which a signal is generated to cancel out a specific primary vibration in a construction.

The invention described can be implemented in systems which have multiple inputs for reference signals and residual signals and multiple outputs for cancellation control signals. As an example, a system is devised here which has one reference signal, one residual signal and one cancellation control signal. The example also relates to a system in which the reference signal is not contaminated by a response from the cancellation control signal. This contamination frequently occurs in stochastic anti-noise systems (see, for example, U.S. Pat. No. 4,677,676). The simplifications in this example do not detract from the general validity of the invention. Generalisation to a multi-channel system, and making allowance for the contamination are within the scope of a person skilled in the art.

Figure 1:
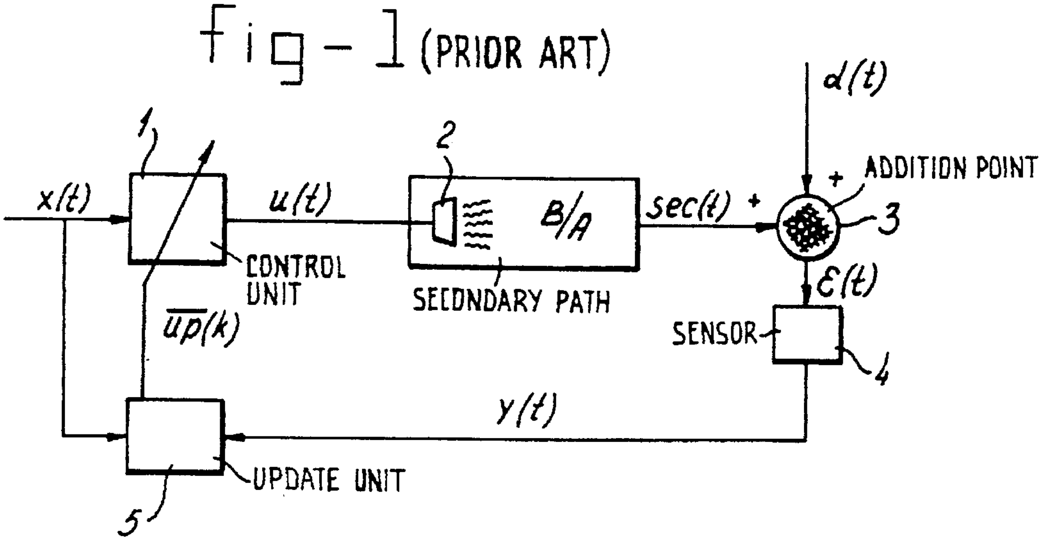
Fig-1 (PRIOR ART)
FIG. 1 shows a block diagram of a known anti-noise or anti-vibration system.

FIG. 1 shows a known system for cancelling out a primary noise signal d(t). The system makes use of a feedforward control strategy in which information relating to the primary signal d(t) to be extinguished is as far as possible known to the system beforehand via the reference signal x(t). This can be realised with the aid of a sensor (for example a microphone or an optical rev counter in the case of an engine) close to the source of the primary signal. The signal originating from the sensor is then submitted to the system as reference signal x(t) via a transmission path which is faster than the transmission path of the primary signal itself.

A control unit 1 receives the reference signal x(t) and, on the basis of the signal, calculates a cancellation control signal u(t) which is supplied to a secondary source 2. In the case of an anti-noise system, the secondary source 2 comprises one or more loudspeakers which generate the desired "anti-noise" on the basis of the cancellation control signal. After the anti-noise signal has travelled over a certain acoustic path having a transfer function B/A, which may or may not be time-dependent, it arrives as secondary signal sec(t) at the location where the primary signal d(t) has to be cancelled out as far as possible. At this location the primary signal d(t) and the secondary signal sec(t) are added together, which is indicated diagrammatically by an addition point 3. The addition point 3 does not have to be a physical addition means; it can also be the space in which the primary signal d(t) and the secondary signal sec(t) meet one another. A residual signal $\epsilon(t)$ then remains at this location, which residual signal is detected by a sensor 4. The sensor 4 can comprise one or more microphones. The signal y(t) emitted by the sensor is fed to an update unit 5, which, on the basis of the signal and on the basis of the reference signal x(t) which is also supplied to the unit, calculates an update signal $\overline{up}(t)$ and feeds the latter to the control unit 1. With the aid of the update signal $\overline{up}(C)$, the filter coefficients of the digital filter present in the control unit are adapted in accordance with a predetermined algorithm. The filter can be an adaptive transversal filter. The adaptation of the filter is needed because the characteristics of the primary signal d(t) can change with time.

In low-frequency systems a function criterion which can be suitably minimized is the square of the acoustic pressure as detected by the sensor 4. A known algorithm which makes use of this is the least mean squares algorithm with filtered reference signal, hereinafter referred to by the abbreviated term "filtered-x-LMS algorithm". The filtered-x-LMS algorithm is based on a normal LMS algorithm for an adaptive filter, which is adapted in order to take account of the effect of a transfer function between the output of the filter and an error signal. The filtered-x-LMS algorithm can be used both for periodic and for stochastic primary signals and can easily be implemented in software and hardware.

Figure 2:
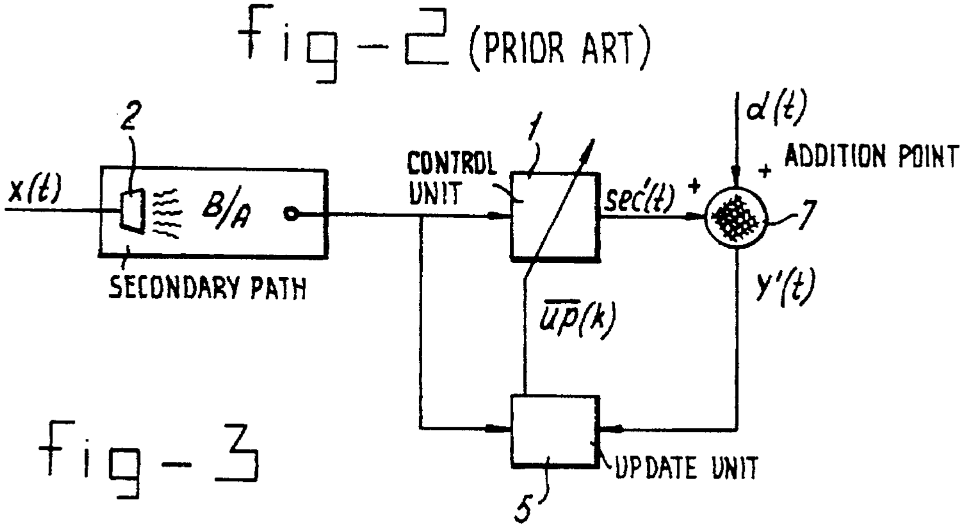
Fig-2 (PRIOR ART)
FIG. 2 shows an equivalent block diagram of a known anti-noise or anti-vibration system in the case of very slow adaptation of the filter coefficients.

FIG. 2 shows a block diagram which forms the basis for the filtered-x-LMS algorithm. If the block diagram according to FIG. 1 were to be used as the basis, the characteristics of the transfer function B/A of the secondary path would be incorporated in the gradient of the residual signal $\epsilon(t)$. Therefore, these characteristics would also have to be incorporated in the update function, as implemented by the update unit 5. Moreover, the residual signal $\epsilon(t)$ is coupled to the status of the digital filter in the control unit 1 at various earlier sampling times because the secondary path inter alia introduces time delays.

Assuming that the variation in the filter coefficients with time is slight compared with the reaction time of the secondary process, the block diagram shown in FIG. 2 is equivalent to that in FIG. 1. In the diagram in FIG. 2, the secondary path has been taken out of the control circuit and positioned between the reference signal x(t) and the input of the control unit 1. Therefore, the reference signal x(t) is, as it were, subjected to the transfer function B/A of the secondary path before being fed to the control unit 1 (and the update unit 5). Elements in FIG. 2 which are the same as those in FIG. 1 are designated by the same reference numerals. FIG. 2 differs from FIG. 1 in a few respects: the secondary signal sec'(t) is an electrical signal, the primary signal d(t) is converted, via a converter 6, into an electrical signal before it is added by an addition unit 7 to the secondary signal sec'(t) and the residual signal y'(t) is already an electrical signal, which can be fed directly to the update unit 5. Application of the LMS algorithm in the system according to FIG. 2 leads to the abovementioned filtered-x-LMS algorithm, which is simple to implement, both in respect of software and in respect of hardware. Further details on this algorithm can be found in: B. Widrow and S. D. Stearns, "Adaptive Signal Processing", Englewood Cliffs, Prentice Hall, 1985; S. J. Elliott, I. M. Stothers and P. A. Nelson, "A multiple error LMS algorithm and its application to the active control of sound and vibration", *IEEE Trans. Acoust., Speech, Signal Processing.*, Vol. ASSP 35, pp. 1423–1434, Oct. 1987; and L. J. Eriksson, M. C. Allie and R. A. Greiner, "The selection and application of an IIR adaptive filter for use in active sound attenuation", *IEEE Trans. Acoust., Speech, Signal Processing,* Vol. ASSP 35, pp. 433–437, April 1987.

Figure 3:
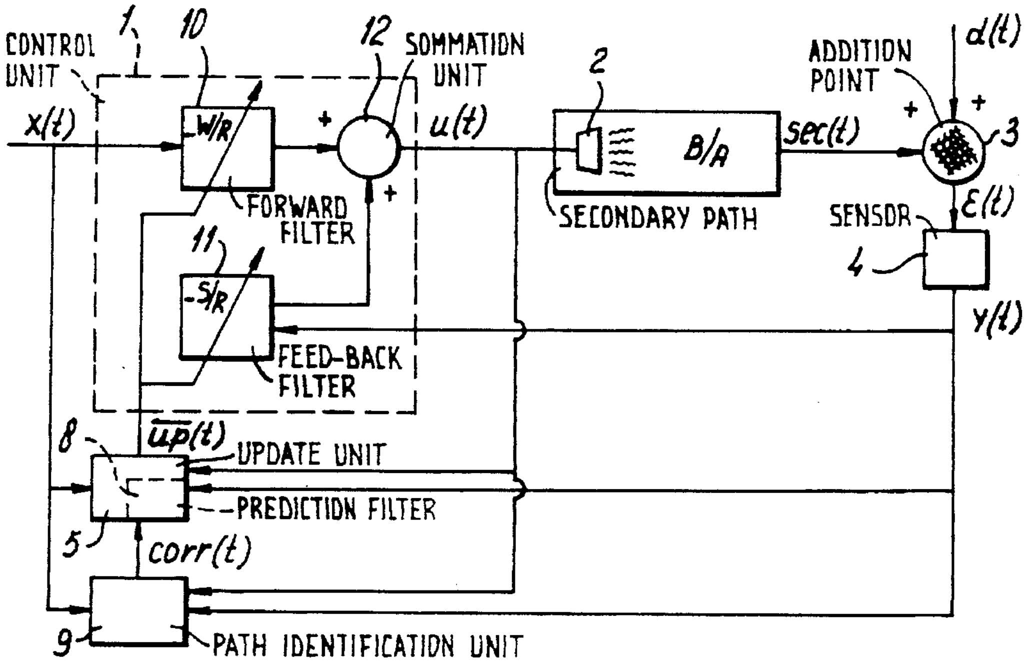
FIG. 3 shows a block diagram of an anti-noise or anti-vibration system according to the invention; and FIGS. **4*a*–4*b*** shows a block diagram of a prediction filter.

It can be demonstrated that the assumption of slowly changing filter coefficients has an adverse effect on the convergence speed of the filtered-x-LMS algorithm. FIG. 3 shows a system with which, according to the invention, the convergence speed can be increased, with retention of the properties of the conventional LMS algorithm, and is therefore also easier to implement in software and hardware than is, for example, the RLS algorithm.

The system according to FIG. 3 follows on from the system according to FIG. 1, in which the secondary path is located between the output of the control unit 1 and the addition point 3, which corresponds better to reality. The secondary signal sec(t) arriving at the addition point 3 is, like the secondary signal sec(t) in FIG. 1, acoustic in nature. The same applies with respect to the residual signal y(t). In addition, elements which are the same as those in FIG. 1 are designated by the same reference numerals.

The problem of the presence of the secondary path with transfer function B/A between the output of the control unit 1 and the addition point 3 is that the cancellation control signal supplied at a specific point in time by the control unit I is at that point in time not yet present at the addition point 3. If the cycle time for the calculation of a specific control signal is equal to T, the delay introduced by the secondary path can, for example, be equal to x.T, where x>>1. A situation could therefore arise in which the control unit generates an ideal cancellation control signal whilst the control unit at the same time receives an update signal $\overline{up}(t)$ (FIG. 1) which is still based on a residual signal y(t) which is determined by one or more "old" cancellation control signals. Incorrect adaptation of the filter coefficients will then take place. This problem would be solved if the new residual signal, which is associated with the cancellation control signal generated by the control unit at that point in time, were to be known directly. This is now the basic concept behind the system according to FIG. 3.

The update unit 5 according to FIG. 3 comprises a prediction filter 8 to predict the residual signal $\epsilon(t)$ which is associated with a specific cancellation control signal u(t) and would be produced after conversion of the cancellation control signal u(t) into an anti-noise signal by the loudspeaker 2 and after propagation of the anti-noise through the secondary path. The predicted residual signal is converted by the update unit 5 into the update signal $\overline{up}(t)$ for the control unit 1. The known LMS algorithm is thus adapted in such a way that the effect of the secondary path is taken directly into account by means of an estimate of the consequences thereof.

FIG. 3 again shows the general situation where the control unit I comprises both a filter for forward coupling 10 and a filter for feedback 11. In general at least a forward coupling is used for anti-noise or anti-vibration applications. However, the addition of a feedback filter 11, for which the measured residual signal y(t) is needed as a third input signal, makes the circuitry more robust. The addition of a feedback filter is particularly important in the case of the cancellation of vibrations, because the propagation speed of vibration is much higher than that of noise, so that a forward control always comes, as it were, too late. Sometimes the forward coupling can even be omitted as a result.

The output signals from the forward filter 10 and the feedback filter 11 are added by a summation unit 12 in order to generate the cancellation control signal u(t). The summation unit 12 can be accommodated inside the control unit 1, as shown in FIG. 3, but this does not have to be the case.

A brief derivation will be given below of a preferred algorithm for updating the filter coefficients of the forward filter 10 and the feedback filter 11, the update unit 5 comprising a prediction filter. In the derivation it will be assumed that there is one sensor 4 with one output signal y(t).

The error criterion which must be minimised is:

$$J(\bar{\theta}) = \frac{1}{2} E\{[y_{pred}(t,\bar{\theta})]^2\} \qquad (1)$$

where:

$\bar{\theta}$=a vector which comprises the coefficients of the filters used;

$y_{pred}(t,\bar{\theta})$=the predicted value of the measured residual signal.

The predicted value $y_{pred}(t,\bar{\theta})$ of the measured residual signal must be generated by the prediction filter 8, which is accommodated in the update unit 5.

The output signal y(t) of the sensor 4 can be written as follows:

$$A(q^{-1})y(t)=B(q^{-1})u(t)+D(q^{-1})x(t)+C(q^{-1})e(t) \qquad (2)$$

where:

e(t)=white noise or an unknown interference signal;

A, B, C, D=system polynomes in the "backward shift" operator $q^{-1}$, where:

$q^{-1}x(t)=x(t-1)$

The formulation of equation (2) takes account of the presence of white noise or other interference signals in the residual signal which do not occur in the reference signal. The following relationship between the input and output signals of the control unit 1 in the configuration given in FIG. 3 can be formulated:

$$R(q^{-1})u(t)=-W(q^{-1})x(t)-S(q^{-1})y(t) \qquad (3)$$

where R comprises the coefficients $[1\ r_1 \ldots r_{nr}]$, W the coefficients $[w_0\ w_1 \ldots w_{nw}]$ and S the coefficients $[s_0\ s_1 \ldots s_{ns}]$. The coefficients of R, W, S form the parameters which are to be sought for the forward filter 10 and the feedback filter 11. In other words: a transfer function —W/R can be defined for the forward filter 10 and a transfer function —S/R can be defined for the feedback filter 11.

The essence of the control according to FIG. 3 is, now, that the criterion function defined in equation (1) is minimised recursively by estimating $\bar{\theta}$ thereof. $\bar{\theta}$ is a vector which comprises all coefficients of R, W, S:

$$\bar{\theta}=[1\ r_1 \ldots r_{nr}/w_0\ w_1 \ldots w_{nw}/s_0\ s_1 \ldots s_{ns}]^T$$

$\bar{\theta}$ is now adapted by iteration in the direction of the negative gradient:

$$\bar{\theta}(t)=\bar{\theta}(t-1)-\mu(t)F^{-1}(t)\ [\partial J(\bar{\theta}(t-1))/\partial\bar{\theta}(t-1)] \qquad (4)$$

where:

$\mu(t)$=step size parameter $F^{-1}$=a matrix for optimising the direction.

If an LMS algorithm is applied, F is then the so-called identity matrix; if, on the other hand, the normalised LMS algorithm known per se is applied, F is then a scalar which is equal to the average of the square of the energy of all input signals $x^F$, $u^F$ and $y^F$ (see equation (7) below for a definition of these signals); if the RLS algorithm (RLS=recursive least squares) is applied, F is then the estimated hessian of the error criterion.

Based on a time-invariant control unit, the following relationship can be drawn up:

$$y(t) = \frac{DR-BW}{AR+BS} \cdot x(t) + \frac{CR}{AR+BS} \cdot e(t) \qquad (5)$$

It follows from equation (5):

$$\frac{\partial y}{\partial w_i} = \frac{-B}{AR+BS} \cdot x(t-i), \quad i=0,1,\ldots n_w \qquad (6)$$

$$\frac{\partial y}{\partial r_j} = \frac{-B}{AR+BS} \cdot u(t-j), \quad j=0,1,\ldots n_r$$

$$\frac{\partial y}{\partial s_k} = \frac{-B}{AR+BS} \cdot y(t-k), \quad k=0,1,\ldots n_s$$

If the following filtered signals are defined:

$$y^{FF}(t) = \frac{B}{A} \cdot y(t) \qquad (7)$$

$$u^{FF}(t) = \frac{B}{A} \cdot u(t)$$

$$x^{FF}(t) = \frac{B}{A} \cdot x(t)$$

$y_{pred}(t)$ can then be written as follows:

$$y_{pred}(t)=y(t)-Wx^{FF}(t)-Ru^{FF}(t)-Sy^{FF}(t) \qquad (8)$$

Figure 4A:
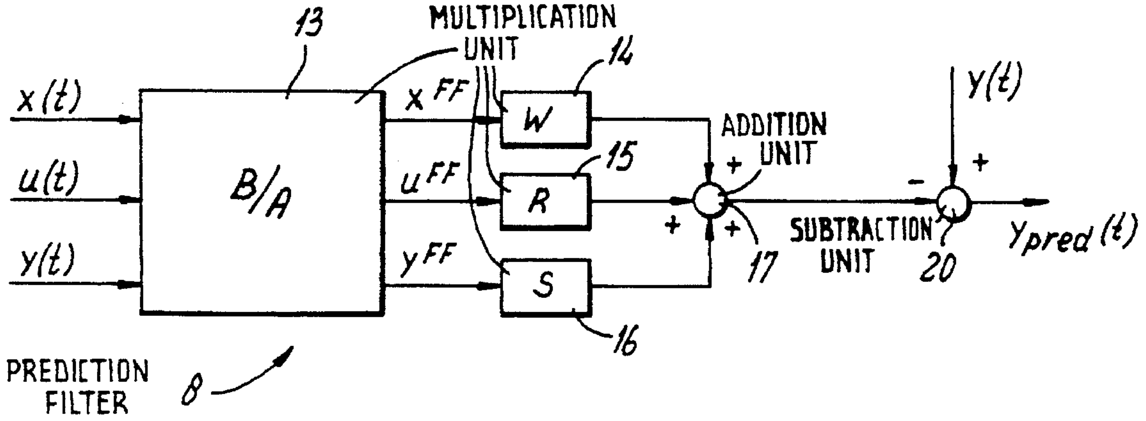

An implementation of a circuit for the generation of the signal vector $y_{pred}(t)$ based on equation (8) is shown in the form of a block diagram in FIG. 4*a*.

The diagram shown in FIG. 4*a* comprises a multiplication unit 13 which receives the reference signal x(t), the cancellation signal u(t) and the output signal y(t) from the sensor(s) 4 as input signals. The input signals are then multiplied by B/A in order to provide the respective signals $x^{FF}(t)$, $u^{FF}(t)$ and $y^{FF}(t)$. The last-mentioned signals are fed to three parallel multiplication units 14, 15 and 16 respectively for multiplication by W, R and S respectively. The output signals from the three multiplication units 14, 15, 16 are fed to an addition unit 17, which has an output connected to an inverting input of a subtraction unit 20. The subtraction unit 20 has a non-inverting input connected to the signal y(t). The subtraction unit 20 supplies the signal $y_{pred}(t)$.

The following recursive relationships can be drawn up for updating the coefficients $w_i$, $r_i$, $s_i$ i=0, 1, . . . ):

$$w_i(t)=w_i(t-1)+\mu(t)\cdot F^{-1}(t)\cdot y_{pred}(t)\cdot x^F(t-i),\ i=0, 1, \ldots\ r_j(t)=r_j(t-1)+\mu(t)\cdot F^{-1}(t)\cdot y_{pred}(t)\cdot u^F(t-j),\ j=1, \ldots\ s_k(t)=s_k(t-1)+\mu(t)\cdot F^{-1}(t)\cdot y_{pred}(t)\cdot y^F(t-k),\ k=0, 1, \ldots \qquad (9)$$

where:

$$y^F(t) = \frac{B}{AR+BS} \cdot y(t)$$

$$u^F(t) = \frac{B}{AR+BS} \cdot u(t)$$

$$x^F(t) = \frac{B}{AR+BS} \cdot x(t)$$

To express it in a different way: three update vectors $\overline{up}_w$, $\overline{up}_R$ and $\overline{up}_s$ respectively can be defined for updating the coefficients of W, R and S respectively:

$$\overline{up_W} = \mu(t) \cdot F^{-1}(t) \cdot y_{pred}(t) \cdot \overline{\phi_x}(t) \quad (10)$$

$$\overline{up_R} = \mu(t) \cdot F^{-1}(t) \cdot y_{pred}(t) \cdot \overline{\phi_u}(t)$$

$$\overline{up_S} = \mu(t) \cdot F^{-1}(t) \cdot y_{pred}(t) \cdot \overline{\phi_y}(t)$$

where:

$$\overline{\phi_x}(t) = [x^F(t) \quad x^F(t-1) \ldots x^F(t-n_w)]^T$$

$$\overline{\phi_u}(t) = [u^F(t-1) \quad u^F(t-2) \ldots u^F(t-n_r)]^T$$

$$\overline{\phi_y}(t) = [y^F(t) \quad y^F(t-1) \ldots y^F(t-n_s)]^T$$

so that:

$$\overline{\theta_W}(t) = \overline{\theta_W}(t-1) + \overline{up_W}(t) \quad (11)$$

$$\overline{\theta_R}(t) = \overline{\theta_R}(t-1) + \overline{up_R}(t)$$

$$\overline{\theta_S}(t) = \overline{\theta_S}(t-1) + \overline{up_S}(t)$$

Figure 4B:
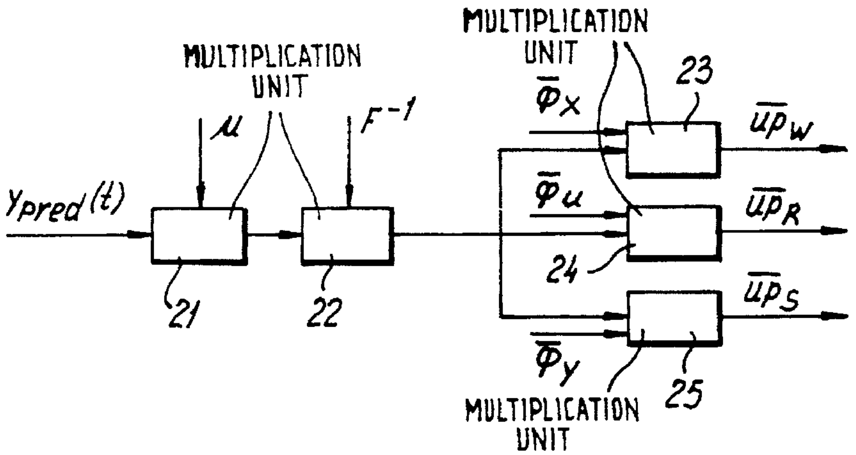

FIG. 4*b* shows a block diagram for a circuit with which the three the update vectors $\overline{up_W}$, $\overline{up_R}$ and $\overline{up_s}$; respectively can be generated.

In the circuit according to FIG. 4*b*, the signal $y_{pred}(t)$ is fed to a circuit comprising a multiplication unit 21 for multiplying by the step size parameter μ(t) and a multiplication unit 22 for multiplying by the direction optimisation matrix $F^{-1}(t)$, connected in series. The output signal from the multiplication unit 22 is fed to three multiplication units 23, 24 and 25, which are connected in parallel, for multiplying by, respectively, $\overline{\phi_x}(t)$, $\overline{\phi_u}(t)$ and $\overline{\phi_y}(t)$ and to provide the respective signals $\overline{up_w}(t)$, $\overline{up_R}(t)$ and $\overline{up_s}(t)$.

The step size parameter μ(t) can assume any desired value. A value which has been found to be suitable in practice when the normalised LMS algorithm is applied is μ=0.6. Simulations have shown that the convergence speed for an algorithm based on equation (9) is significantly faster than that for a filtered-x-LMS algorithm. The convergence behaviour is comparable with that of a conventional LMS algorithm in a control circuit without a secondary path with transfer function B/A.

It will be evident that if a feedback filter 11 is not used then: S=0 and that if a forward filter 10 is not used then: W=0. The widely used transversal filter is achieved with S=0 and R=1.

As will be obvious to a person skilled in the art, the various filters mentioned—the prediction filter 8, the forward filter 10 and the feedback filter 11—do not have to be filter units which are distinguishable in terms of hardware. They can each be implemented in software in a manner known to a person skilled in the art. The control unit 1 can, for example, be incorporated in a computer, in which the update unit 5 with the prediction filter 8 is also located.

In the above it has been assumed that the secondary transfer path having transfer function B/A is time-invariant. In reality this is seldom the case because, for example, changes in temperature and physical changes in the secondary path cause the coefficients of the transfer function B/A to change with time. Ideally, the coefficients must continuously be adapted to reality. With the system according to FIG. 3, the changing coefficients of the transfer function B/A over time can be estimated and taken into account in the calculations. To this end, the output of the sensor(s) 4 is also coupled to a path identification unit 9, which generates an estimate of the coefficients of the transfer function B/A. The path identification unit 9 also receives the reference signal x(t) and has an output coupled to the update unit 5. Via the connection with the update unit 5, the path identification unit 9 transmits a signal corr(t), which represents the estimated values of the coefficients of the transfer vector. The signal corr(t) is used by the update unit 5 to adapt the values of the coefficients of the transfer function B/A if necessary. Various algorithms are known which can be used for correct path identification. See, for example: G. C. Goodwin and K. S. Sin, "Adaptive Filtering, Prediction and Control", Englewood Cliffs, Prentice Hall, 1984; and T Söderström and P. Stoica, "System Identification", Englewood Cliffs, Prentice Hall, 1989. The invention is not restricted to one of the specific algorithms described in the publications.

We claim:

1. A system for the generation of a time variant signal (sec(t)) for suppression of a primary signal (d(t)) at an addition point (3), comprising:

a control unit (1) provided with at least one digital filter (10, 11), a first control unit input for receiving a reference signal (x(t)), and for providing said reference signal (x(t) to said at least one digital filter, a second control unit input for receiving an update signal (up(t)) for updating coefficients of said at least one digital filter (10, 11) and a control unit output for providing a cancellation control signal (u(t)) in response to an output from said at least one digital filter;

cancellation-generating means (2) which is connected to the output of the control unit (1) for the generation of a cancellation signal to be transmitted through a secondary transfer path having a secondary path transfer function (B/A) corresponding to a certain reaction time, to render said time variant signal (sec(t)) at said addition point (3);

sensor means (4) for measuring a residual signal (ε(t)) resulting from adding said time variant signal (sec(t)) and said primary signal (d(t)) at the addition point (3), and for providing an output signal (y(t));

update means (5) provided with a first update means input for receiving said output signal (y(t)), a second update means input for receiving said cancellation control signal (u(t)), and a third update means input for receiving said reference signal (x(t)), which update means is arranged to establish said update signal (up(t)) based on the signals received on said first, second and third update means inputs, said update signal (up(t)) being provided at an update means output, wherein said update means (5) is provided with a prediction filter (8) which is arranged to calculate a predicted value ($y_{pred}(t)$) based on the signals actually received on said first, second, and third update means inputs such that said predicted value ($y_{pred}(t)$) equals an anticipated, calculated output value of said sensor means (4), calculated under the assumption that said coefficients of said at least one digital filter (10, 11) were already updated in accordance with the signals actually received on said first, second, and third update means inputs and taking into account the secondary path transfer function (B/A), said predicted value ($y_{pred}(t)$) being used by said update means to calculate the update signal (up(t)) to be transmitted to the control unit (1) in accordance with a predetermined algorithm.

2. A system according to claim 1, wherein the at least one digital filter comprises a forward filter (10).

3. A system according to claim 1, wherein the control unit (1) has a third control unit input for receiving the output signal (y(t)) from the sensor means (4) and the at least one digital filter comprises a feedback filter (11).

4. A system according to claim 2, wherein the forward filter (10) is selected from the following possible filters: a transversal filter and a recursive filter.

5. A system according to claim 3, wherein the feedback filter (11) is selected from the following possible filters: a transversal filter and a recursive filter.

6. A system according to claim 1, wherein the prediction filter (8) is equipped to calculate the predicted value ($y_{pred}(t)$) in accordance with the following equation:

$$y_{pred}(t) = y(t) - Wx^{FF}(t) - Ru^{FF}(t) - Sy^{FF}(t)$$

where:

W indicates a first time vector $$W(t) = [w_0(t)\ w_1(t) \ldots w_{nw}(t)]$$

R indicates a second time vector $$R(t) = [1\ r_1(t) \ldots r_{nr}(t)]$$

S indicates a third time vector $$S(t) = [s_0(t)\ s_1(t) \ldots s_{ns}(t)]$$

W(o), R(O), and S(o) have predetermined values and W(t),

R(t), S(t) for t>o are determined by:

$$\bar{\theta}(t) = \bar{\theta}(t-1) - \mu(t)F^{-1}(t)[\partial J(\bar{\theta}(t-1))/\partial\bar{\theta}(t-1)]$$

where:

$\mu(t)$=step size parameter $F^{-1}$=a matrix for optimising the direction.

$\bar{\theta} = [1 r_1(t) \ldots I_{nr}(t)/w_o(t) \ldots w_{nw}(t)/\ s_o(t) \ldots s_{ns}(t)]$ and wherein input signals $y^{FF}(t)$, $u^{FF}(t)$ and $x^{FF}(t)$ are defined as follows:

$$y^{FF}(t) = \frac{B}{A} \cdot y(t)$$

$$u^{FF}(t) = \frac{B}{A} \cdot u(t)$$

$$x^{FF}(t) = \frac{B}{A} \cdot x(t)$$

where:

B/A=transfer function of the secondary transfer path.

7. A system according to claim 6, wherein the update means (5) are equipped to calculate the update signal in accordance with the following three components:

$$\overline{up_W} = \mu(t) \cdot F^{-1}(t) \cdot y_{pred}(t) \cdot \overline{\phi_x}(t)$$

$$\overline{up_R} = \mu(t) \cdot F^{-1}(t) \cdot y_{pred}(t) \cdot \overline{\phi_u}(t)$$

$$\overline{up_S} = \mu(t) \cdot F^{-1}(t) \cdot y_{pred}(t) \cdot \overline{\phi_y}(t)$$

where:

$$\overline{\phi_x}(t) = [x^F(t) \quad x^F(t-1) \ldots x^F(t-n_w)]^T$$

$$\overline{\phi_u}(t) = [u^F(t-1) \quad u^F(t-2) \ldots u^F(t-n_r)]^T$$

$$\overline{\phi_y}(t) = [y^F(t) \quad y^F(t-1) \ldots y^F(t-n_s)]^T$$

-continued where:

$$y^F(t) = \frac{B}{AR + BS} \cdot y(t)$$

$$u^F(t) = \frac{B}{AR + BS} \cdot u(t)$$

$$x^F(t) = \frac{B}{AR + BS} \cdot x(t)$$

and the control unit is equipped to update the filter coefficients of the forward filter having transfer function —W/R and of the feedback filter having transfer function —S/R in accordance with:

$$\theta_W(t) = \theta_W(t-1) + up_W(t)$$

$$\theta_R(t) = \theta_R(t-1) + up_R(t)$$

$$\theta_S(t) = \theta_S(t-1) + up_S(t).$$

8. A system according to claim 7, wherein the update means (5) is equipped to calculate the update signal with the aid of the LMS algorithm known per se, so that F is equal to the identity matrix.

9. A system according to claim 7, wherein the update means (5) is equipped to calculate the update signal with the aid of the normalised LMS algorithm known per se, so that F is equal to the average of the square of the energy of the signals $x^F$, $u^F$ and $y^F$.

10. A system according to claim 7, wherein the update means (5) is equipped to calculate the update signal with the aid of the RLS algorithm known per se, so that F is equal to the estimated hessian of the error criterion.

11. A system according to claim 2, wherein the forward filter (10) is implemented in software.

12. A system according to claim 1, wherein both the update means (5) and the prediction filter (8) are implemented in software.

13. A system according to claim 1, wherein the cancellation-generating means (2) comprises one or more loudspeakers and the sensor means (4) comprises one or more microphones.

14. A system according to claim 1, wherein the cancellation-generating means (2) comprise at least one vibration actuator and the sensor means comprise at least one vibration recorder.

15. A system according to claim 1, provided with an identification unit (9) having a first identification unit input for receiving the output signal (y(t)), a second identification unit input for receiving the reference signal (x(t)), a third identification unit input for receiving the cancellation control signal (u(t)) and an identification unit output which is coupled to the prediction filter (8) for providing an estimate of the transfer function (B/A) of the secondary transfer path.

16. A system according to claim 3 wherein the feedback filter is implemented in software.

* * * * *